(12) United States Patent
Dyer

(10) Patent No.: US 7,910,451 B2
(45) Date of Patent: Mar. 22, 2011

(54) SIMULTANEOUS BURIED STRAP AND BURIED CONTACT VIA FORMATION FOR SOI DEEP TRENCH CAPACITOR

(75) Inventor: Thomas W. Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 348 days.

(21) Appl. No.: 12/098,019

(22) Filed: Apr. 4, 2008

(65) Prior Publication Data

US 2009/0250738 A1 Oct. 8, 2009

(51) Int. Cl.
*H01L 21/20* (2006.01)
(52) U.S. Cl. .................. 438/386; 257/E21.081
(58) Field of Classification Search .................. 257/296, 257/301, 305, 510, E27.081; 438/243, 386, 438/597
See application file for complete search history.

(56) References Cited

U.S. PATENT DOCUMENTS

| | | | |
|---|---|---|---|
| 6,964,897 B2* | 11/2005 | Bard et al. | 438/243 |
| 7,015,526 B2* | 3/2006 | Bonart | 257/301 |
| 7,073,139 B2* | 7/2006 | Bard et al. | 716/1 |
| 2003/0022457 A1* | 1/2003 | Gutsche et al. | 438/386 |
| 2006/0202249 A1* | 9/2006 | Cheng et al. | 257/301 |

OTHER PUBLICATIONS

Ricardo A. Donaton, et al.—"Design and Fabrication of MOSFET's with a Reverse Embedded SiGe (Rev. e-SiGe) Structure" IEEE (2006).

* cited by examiner

*Primary Examiner* — Nathan W Ha
(74) *Attorney, Agent, or Firm* — Scully, Scott, Murphy & Presser, P.C.; Joseph P. Abate, Esq.

(57) ABSTRACT

A node dielectric, an inner electrode, and a buried strap cavity are formed in the deep trench in an SOI substrate. A buried layer contact cavity is formed by lithographic methods. The buried strap cavity and the buried layer contact cavity are filled simultaneously by deposition of a conductive material, which is subsequently planarized to form a buried strap in the deep trench and a buried contact via outside the deep trench. The simultaneous formation of the buried strap and the buried contact via enables formation of a deep trench capacitor in the SOI substrate in an economic and efficient manner.

20 Claims, 13 Drawing Sheets

SIMULTANEOUS BURIED STRAP AND BURIED CONTACT VIA FORMATION FOR SOI DEEP TRENCH CAPACITOR

FIELD OF THE INVENTION

The present invention relates to a semiconductor structure, and particularly to a deep trench capacitor in a semiconductor-on-insulator (SOI) substrate including a buried strap and a buried layer contact, and methods of manufacturing the same.

BACKGROUND OF THE INVENTION

Deep trench capacitors are used in a variety of semiconductor chips for high areal capacitance and low device leakage. Typically, a deep trench capacitor provides a capacitance in the range from about 4 fF to about 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Semiconductor-on-insulator (SOI) devices formed on an SOI substrate or on a hybrid substrate provide high performance in advanced semiconductor chips. In SOI devices, the capacitive coupling between a substrate and semiconductor devices is reduced by the presence of a buried insulator layer. By forming a deep trench capacitor in the SOI substrate, SOI logic devices such as SOI transistors and deep trench capacitors may be formed on the same SOI substrate, thereby enabling embedding of deep trench capacitors into the SOI substrate that also contain high performance SOI logic devices.

Formation of a deep trench capacitor in an SOI substrate requires formation of an electrical contact to the outer node of the deep trench capacitor. In a bulk substrate, such an electrical contact to the outer node is accommodated by an ion implantation that forms a reachthrough region comprising a doped portion of the bulk substrate that extends from a top surface of the bulk substrate to a buried layer, which is electrically connected to a buried plate located on the outer sidewalls of the deep trench and constituting the outer node of the deep trench capacitor. In an SOI substrate, however, the presence of the buried insulator layer prevents formation of such a reachthrough since the buried insulator cannot be converted into a conductive structure by ion implantation.

In view of the above, there exists a need for a deep trench capacitor in an SOI substrate in which the outer node of the capacitor is electrically connected to a top surface of the SOI substrate by a conductive structure.

Further, there exists a need for methods of manufacturing such a deep trench capacitor in an SOI substrate with minimal additional processing steps over the processing steps required for manufacture of a deep trench in a bulk substrate.

SUMMARY OF THE INVENTION

The present invention addresses the needs described above by providing a semiconductor structure comprising a deep trench capacitor having a buried strap and a buried contact via that may be simultaneously formed, and methods of manufacturing the same.

A node dielectric, an inner electrode, and a buried strap cavity are formed in a deep trench in an SOI substrate by deposition steps followed by a recess etch. Prior to filling the buried strap cavity, a photoresist is applied and lithographically patterned to form a hole displaced from the buried strap cavity. The pattern of the hole is transferred through a top semiconductor layer and a buried insulator to form a buried layer contact cavity. After removal of the photoresist, the buried strap cavity and the buried layer contact cavity are filled simultaneously by deposition of a conductive material, which is subsequently planarized to form a buried strap in the deep trench and a buried contact via outside the deep trench. The simultaneous formation of the buried strap and the buried contact via allows formation of a deep trench capacitor in the SOI substrate in an economic and efficient manner.

According to an aspect of the present invention, a method of forming a semiconductor structure is provided, which comprises:

forming a deep trench in a semiconductor-on-insulator (SOI) substrate;

forming an inner electrode in the deep trench;

forming a buried strap cavity over the inner electrode in an upper portion of the deep trench;

forming a buried layer contact cavity extending from a top surface of a top semiconductor layer of the SOI substrate to a depth beneath a bottom surface of a buried insulator layer; and simultaneously forming a buried strap within the buried strap cavity and a buried contact via within the buried layer contact cavity, wherein the buried strap and the buried contact via comprise a same conductive material.

In one embodiment, the method further comprises forming a node dielectric layer directly on sidewalls of the deep trench.

In another embodiment, the method further comprises forming at least one inner conductor layer within the deep trench on the node dielectric layer, wherein the at least one conductive layer comprises a polycrystalline doped semiconductor layer or an amorphous doped semiconductor layer.

In yet another embodiment, the method further comprises:

applying a photoresist over the top surface of the top semiconductor layer and within the buried strap cavity;

lithographically patterning a hole in the photoresist over an area outside the deep trench; and anisotropically etching the top semiconductor layer and the buried insulator layer underneath the hole to a depth beneath a bottom surface of the buried insulator layer employing the photoresist as an etch mask, wherein a void within the top semiconductor layer and the buried insulator layer beneath the hole constitutes the buried layer contact cavity.

According to another aspect of the present invention, a semiconductor structure is provided, which comprises:

a deep trench located in a semiconductor-on-insulator (SOI) substrate;

a buried plate laterally surrounding sidewalls of the deep trench and comprising a doped semiconductor material;

a buried doped semiconductor layer abutting a bottom surface of a buried insulator layer in the SOI substrate and abutting an upper portion of the buried plate;

an inner electrode located inside the deep trench and beneath a top surface of the buried insulator layer;

a buried strap located inside the deep trench and abutting a top surface of the inner electrode; and a buried contact via extending from a top surface of a top semiconductor layer of the SOI substrate to the buried doped semiconductor layer, wherein the buried strap have the same material composition as the buried contact via.

In one embodiment, the semiconductor structure further comprises a semiconductor portion located in a bottom semiconductor layer of the SOI substrate and laterally abutting and surrounding the buried plate, wherein the semiconductor portion has a doping of first conductivity type, the buried plate has a doping of a second conductivity type, the buried doped semiconductor layer has a doping of the second conductivity type, wherein the second conductivity type is the opposite of the first conductivity type.

In another embodiment, the buried strap and the buried contact via comprise a polycrystalline doped semiconductor material having a same conductivity type as the buried doped semiconductor layer or a metallic material.

In yet another embodiment, the semiconductor structure further comprises:

a field effect transistor located in the top semiconductor layer, wherein a source region of the field effect transistor laterally abuts the buried strap;

a drain contact via electrically connected to a drain region of the field effect transistor; and an overlying contact via electrically connected to the buried contact via and located over and on the buried contact via.

DETAILED DESCRIPTION OF THE INVENTION

Figure 1:
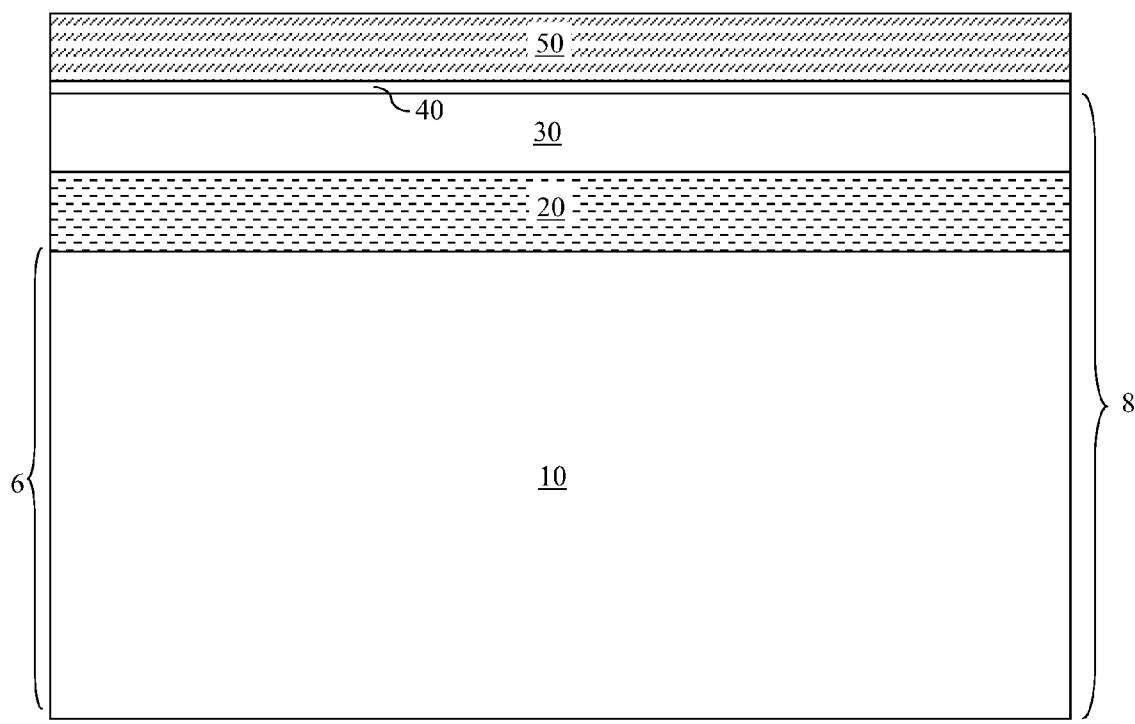
FIG. 1 is a vertical cross-sectional view of an exemplary semiconductor structure after formation of a first pad dielectric layer 40 and a second pad dielectric layer 50 according to the present invention.

As stated above, the present invention relates to a deep trench capacitor in a semiconductor-on-insulator (SOI) substrate including a buried strap and a buried layer contact and methods of manufacturing the same, which are now described in detail with accompanying figures. It is noted that like reference numerals refer to like elements across different embodiments.

Referring to FIG. 1, an exemplary semiconductor structure according to the present invention comprises a semiconductor-in-insulator (SOI) substrate 8 containing a top semiconductor layer 30, a buried insulator layer 20, and a bottom semiconductor layer 6. Each of the top semiconductor layer 30 and the bottom semiconductor layer 6 comprises a semiconductor material. The semiconductor material of the top semiconductor layer 30 and the semiconductor material of the bottom semiconductor layer 6 may be the same, or different. The semiconductor material for the top semiconductor layer 30 and the bottom semiconductor layer 6 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon.

Preferably, the top semiconductor layer 30 comprises a single crystalline material having an epitaxial alignment throughout an entirety of the top semiconductor layer 30. However, embodiments in which the top semiconductor layer 30 and/or the bottom semiconductor layer 6 comprise at least one polycrystalline or amorphous semiconductor material are contemplated herein also. Preferably, the bottom semiconductor layer 6 also comprises a single crystalline material having an epitaxial alignment throughout an entirety of the bottom semiconductor layer 6. At this step, the entirety of the bottom semiconductor layer 6 comprises a semiconductor portion 10, which may have a doping of a first conductivity type at a dopant concentration from about $1.0 \times 10^{14}/cm^3$ to about $1.0 \times 10^{19}/cm^3$, and typically from $1.0 \times 10^{14}/cm^3$ to about $1.0 \times 10^{19}/cm^3$. While the present invention is described with an SOI substrate 8, implementation of the present invention in an SOI portion of a hybrid substrate is explicitly contemplated herein. The thickness of the top semiconductor layer 30 may be from about 10 nm to about 300 nm, and typically from about 30 nm to about 150 nm, although lesser and greater thicknesses are contemplated herein also.

The buried insulator layer 20 vertically abuts a top surface of the bottom semiconductor layer 6 and a bottom surface of the top semiconductor layer 30. The buried insulator layer 20 comprises a dielectric material such as silicon oxide, silicon nitride, silicon oxynitride, or a stack thereof. Typically, the buried insulator layer 20 comprises silicon oxide. The thickness of the buried insulator layer 20 may be from about 30 nm to about 600 nm, and typically from about 60 nm to about 300 nm, although lesser and greater thickness are contemplated herein also.

At least one pad dielectric layer is formed on the top surface of the top semiconductor layer 30. The at least one pad dielectric layer may comprise a first pad dielectric layer 40 and a second pad dielectric layer 50. The first pad dielectric layer 40 may comprise a semiconductor oxide, which may be formed by thermal oxidation of the semiconductor material of the top semiconductor layer 30 or by chemical vapor deposition (CVD). For example, if the top semiconductor layer 30 comprises silicon, the semiconductor oxide is silicon oxide. The first pad dielectric layer 40 may have a thickness from about 1 nm to about 30 nm, and typically from about 3 nm to about 15 nm.

The second pad dielectric layer 50 may comprise a semiconductor nitride, which may be formed by chemical vapor deposition (CVD) such as low pressure chemical vapor deposition (LPCVD), rapid thermal chemical vapor deposition (RTCVD), plasma enhanced chemical vapor deposition (PECVD), high density plasma chemical vapor deposition (HDPCVD), etc. The second pad dielectric layer 50 comprises a material that may be employed as an etch stop layer and/or a planarization stopping layer in subsequent processing steps. For example, the second pad dielectric layer may comprise silicon nitride. The thickness of the second pad dielectric layer 50 may be from about 40 nm to about 300 nm, and typically from about 80 nm to about 200 nm, although lesser and greater thicknesses are contemplated herein also.

Figure 2:
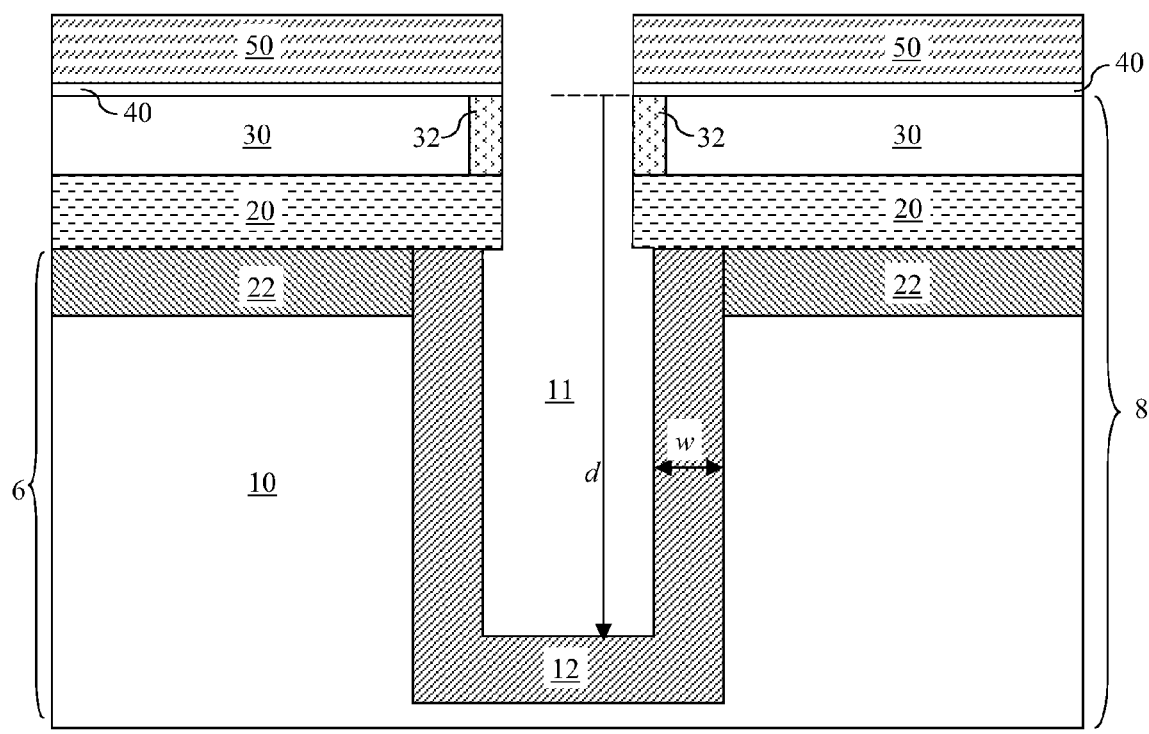
FIG. 2 is a vertical cross-sectional view of the exemplary semiconductor structure after formation of a buried plate 12 and a buried doped semiconductor layer 22 according to the present invention.

Referring to FIG. 2, a masking layer (not shown) is formed above the at least one pad dielectric layer (40, 50) to function as a hard mask. The masking layer may comprise a silicon oxide based material such as undoped silicate glass (USG), a borosilicate glass (BSG), etc. A photoresist (not shown) is applied over the masking layer and a lithographic pattern containing a hole is formed in the photoresist. The pattern in the photoresist is transferred by a first anisotropic etch into the at least one pad dielectric layer (40, 50), the top semiconductor layer 30, and to a depth between the top surface of the buried insulator layer 20 and the bottom surface of the buried insulator layer 20. The photoresist is removed selective to the masking layer. A top semiconductor collar dielectric 32 is formed by thermal oxidation of the sidewalls of the top semiconductor layer 30 exposed to the deep trench 11. In case the top semiconductor layer 30 comprises silicon, the top semiconductor collar dielectric 32 comprises silicon oxide.

The deep trench 11 is further extended downward by a second anisotropic etch into the SOI substrate 8. Specifically, the deep trench is extended downward through the buried insulator layer 20 into the bottom semiconductor layer 6. The depth d of the deep trench 11 after the second anisotropic etch, as measured from the top surface of the top semiconductor layer 30 to a bottom surface of the deep trench 11, may be from about 2 µm to about 10 µm, and typically from about 4 µm to about 8 µm. The portion of the deep trench 11 in the bottom semiconductor layer 6 may be laterally expanded underneath the bottom surface of the buried insulator layer 20 by an isotropic etch, which may be a wet etch or a dry etch.

A buried plate 12 is formed by introducing dopant of a second conductivity type through the sidewalls and the bottom surface of the portion of the deep trench 11 into a portion of the bottom semiconductor layer 6 laterally surrounding and enclosing the deep trench 11. The second conductivity is the opposite of the first conductivity type. For example, the first conductivity type may be p-type and the second conductivity type may be n-type, or vice versa. Examples of the dopants include B, Ga, In, P, As, Sb, etc. The dopants may be introduced by ion implantation, plasma doping, or outdiffusion from a dopant containing material such as arsenosilicate glass (ASG), borosilicate glass (BSG), phosphosilicate glass (PSG), etc. The lateral width w of the buried plate may be from about 20 nm to about 400 nm, and typically from about 50 nm to about 200 nm, although lesser and greater widths are contemplated herein. The dopant concentration The dopant concentration of the buried plate 12 may be from about $1.0\times10^{17}/cm^3$ to about $1.0\times10^{21}/cm^3$, and typically from $1.0\times10^{18}/cm^3$ to about $1.0\times10^{20}/cm^3$.

A buried doped semiconductor layer 22 is formed by ion implantation of dopants of the second conductivity type to a portion of the bottom semiconductor layer 6 directly underneath the buried dielectric layer 20. The thickness of the buried doped semiconductor layer 22 may be from about 50 nm to about 1,000 nm, and typically from 150 nm to about 600 nm, although lesser and greater thicknesses are contemplated herein also. The dopant concentration of the buried doped semiconductor layer 22 may be from about $1.0\times10^{17}/cm^3$ to about $1.0\times10^{21}/cm^3$, and typically from $1.0\times10^{18}/cm^3$ to about $1.0\times10^{20}/cm^3$. The buried plate 12 and the buried doped semiconductor layer 22 have a doping of the same conductivity type, i.e., the second conductivity type, which is the opposite of the conductivity type of the semiconductor portion 10. Additional dopants of the second conductivity type may be introduced to an upper portion of the buried plate 12 during the implantation of the dopants of the second conductivity type. The buried plate 12 laterally abuts the buried doped semiconductor layer 22. Alternatively, the buried doped semiconductor layer 22 may be formed prior to formation of the deep trench 11, or at any later processing step at which the exemplary semiconductor structure has a planar top surface.

Figure 3:
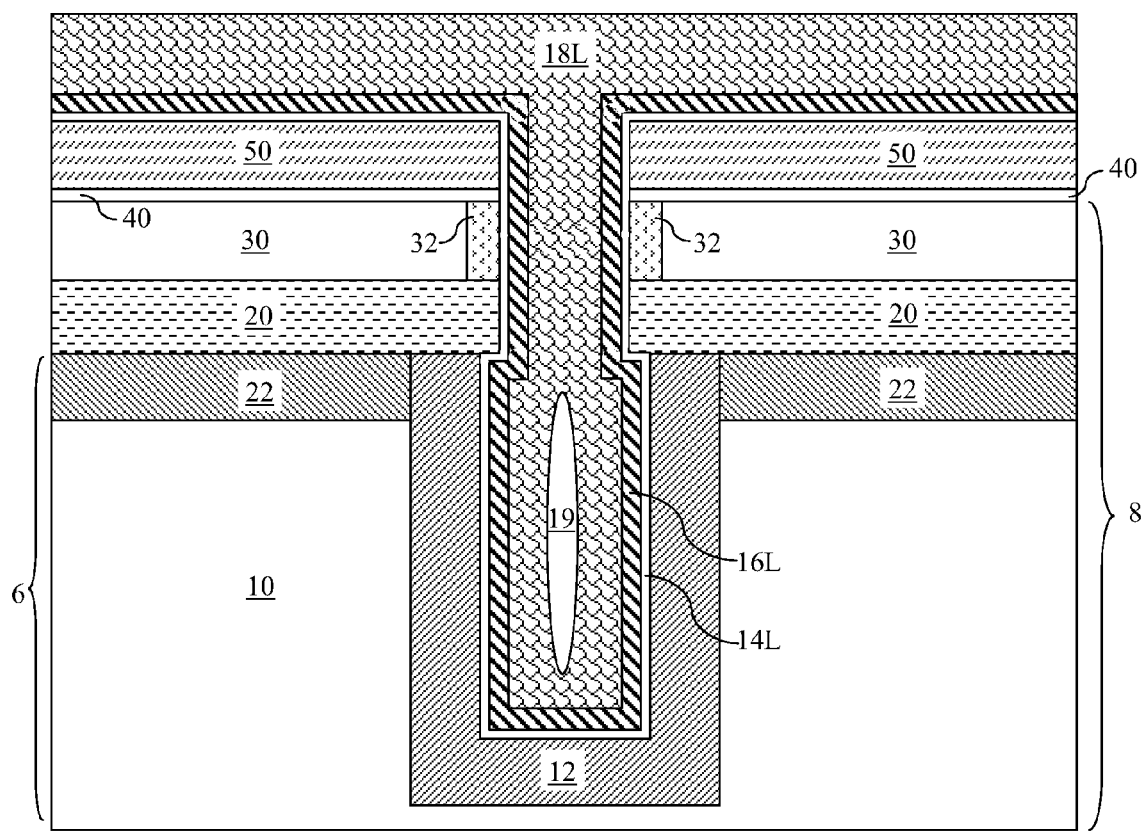
FIG. 3 is a vertical cross-sectional view of the exemplary semiconductor structure after deposition of a node dielectric layer 14L, a metallic inner electrode layer 16L, and a polycrystalline or amorphous doped semiconductor layer 18L according to the present invention.

Referring to FIG. 3, a node dielectric layer 14L is formed directly on the buried plate 12, the outer surfaces of the top semiconductor collar dielectric 32, and the at least one pad dielectric layer (40, 50) by methods known in the art including, but not limited to, thermal oxidation, thermal nitridation, chemical vapor deposition (CVD), atomic layer deposition (ALD), or a combination of thereof. The node dielectric layer 14L may comprise silicon oxide, silicon nitride, a high-k material having a dielectric constant greater than the dielectric constant of silicon nitride, or any suitable combination of these materials. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the node dielectric layer 14L may be from about 3 nm to about 10 nm, although lesser and greater thickness are also explicitly contemplated herein.

At least one inner conductor layer comprising a conductive material is formed directly on the node dielectric layer 14L within the deep trench 11 and over the top surface of the at least one dielectric pad layer (40, 50). The at least one inner conductor layer may consist of a polycrystalline or amorphous doped semiconductor layer 18L, or may comprise a metallic inner electrode layer 16L and a polycrystalline or amorphous doped semiconductor layer 18L. Alternately, the at least one conductor layer may comprise a plurality of metallic inner electrode layers 16L, each separated from another by at least one polycrystalline or amorphous doped semiconductor layer 18L, or a plurality of polycrystalline or amorphous doped semiconductor layers 18L, each separated from another by at least one metallic inner electrode layer 16L.

The metallic inner electrode layer 16L comprises a conductive metallic material such as transition elements (i.e., elements in group III B, group IVB, group V B, group VI B, group VII B, group VIII B, Lanthanides, and Actinides), Al, Ga, In, Tl, Sn, Pb, Bi, an alloy thereof, a conductive nitride thereof, or an alloy of conductive nitrides thereof. For example, the conductive metallic material may comprise Ti, Ta, W, Cu, Co, TiN, TaN, WN, etc. The metallic inner electrode layer 16L may be formed by chemical vapor deposition (CVD), physical vapor deposition (PVD), atomic layer deposition, etc. The deposition process employed for formation of the metallic inner electrode layer 16L may be conformal or non-conformal. The thickness of the metallic inner 16L may be from about 5 nm to about 100 nm, and typically from about 10 nm to about 50 nm, although lesser and greater thicknesses are contemplated herein.

The polycrystalline or amorphous doped semiconductor layer 18L comprises a doped semiconductor material including, but not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, other compound semiconductor materials, and/or alloys thereof. The polycrystalline or amorphous doped semiconductor layer 18L may be polycrystalline or amorphous. The polycrystalline or amorphous doped semiconductor layer 18L may have a doping of the first conductivity type or the second conductivity type, i.e., p-type or n-type. The dopant concentration of the polycrystalline or amorphous doped semiconductor layer 18L may be from about $1.0 \times 10^{19}/cm^3$ to about $1.0 \times 10^{21}/cm^3$, and typically from $3.0 \times 10^{19}/cm^3$ to about $5.0 \times 10^{20}/cm^3$, although lesser and greater dopant concentrations are also contemplated herein.

The polycrystalline or amorphous doped semiconductor layer 18L may be formed by chemical vapor deposition (CVD), physical vapor deposition (PVD), atomic layer deposition, etc. The deposition process employed for formation of the polycrystalline or amorphous doped semiconductor layer 18L may be conformal or non-conformal. The doping of the polycrystalline or amorphous doped semiconductor layer 18L may be effected by in-situ doping, or by layered doping in which at least one layer of dopants is incorporated within the polycrystalline or amorphous doped semiconductor layer 18L during deposition. The thickness of the polycrystalline or amorphous doped semiconductor layer 18L, as measured on top of the at least one pad dielectric layer (40, 50), is greater than one half of the width of the deep trench 11 at the level of the top semiconductor layer 30 so that the portion of the deep trench 11 between the top surface of the top semiconductor layer 30 and the bottom surface of the buried insulator layer 20 is filled with the polycrystalline or amorphous doped semiconductor material. The thickness of the polycrystalline or amorphous doped semiconductor layer 18L may be from about 40 nm to about 300 nm, and typically from about 80 nm to about 200 nm, although lesser and greater thicknesses are contemplated herein. In case the width of the deep trench 11 underneath the bottom surface of the buried insulator layer 20 is greater than the width of the deep trench 11 above the bottom surface of the buried insulator layer 20 as in a bottle-shaped trench, a cavity 19 may be formed underneath the bottom surface of the buried insulator layer 20 within the material of the polycrystalline or amorphous doped semiconductor layer 18L.

Figure 4:
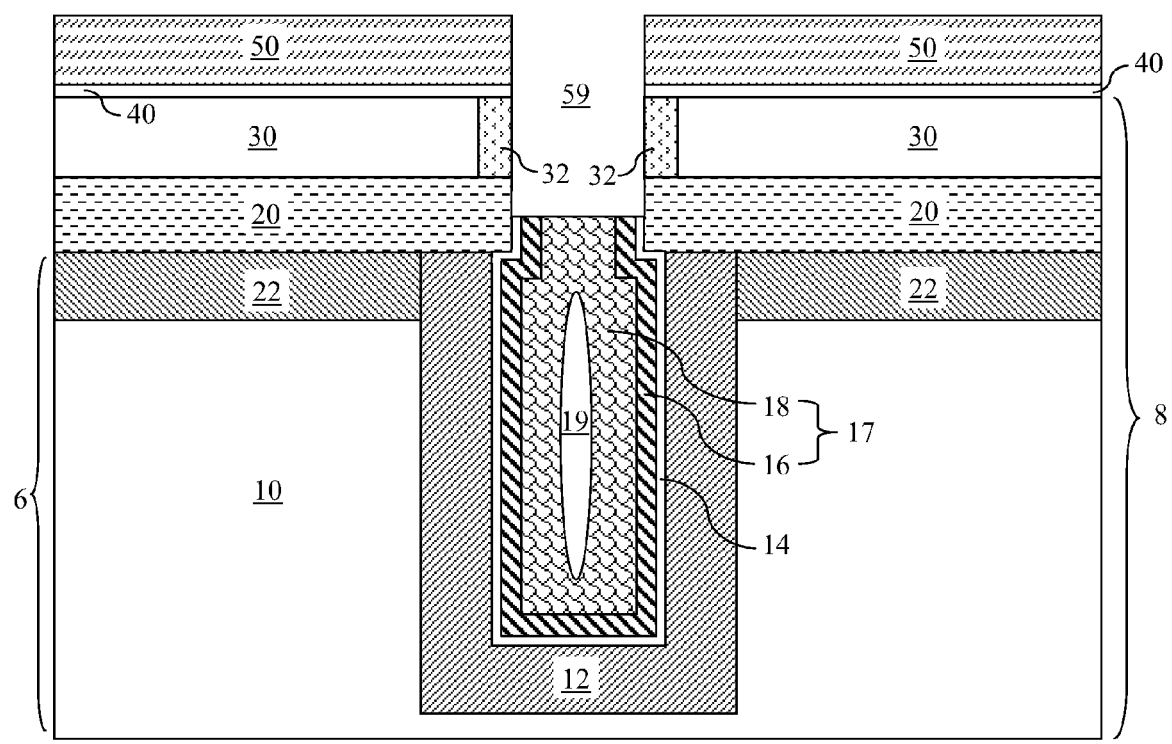
FIG. 4 is a vertical cross-sectional view of the exemplary semiconductor structure after formation of a buried strap cavity 59 according to the present invention.
Figure 5:
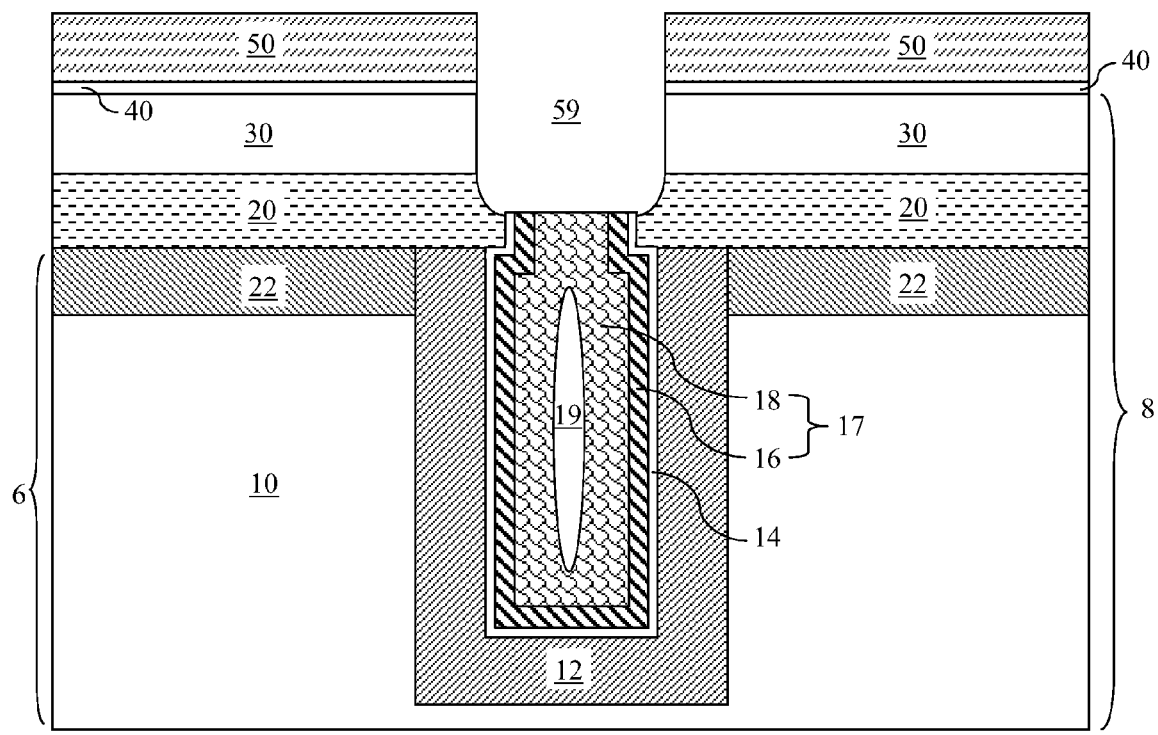
FIG. 5 is a vertical cross-sectional view of the exemplary semiconductor structure after lateral pull back of a first pad dielectric layer 40 and a second pad dielectric layer 50 and removal of a top semiconductor collar dielectric 32 according to the present invention.

Referring to FIG. 4, the portions of the at least one inner conductor layer (18L, 16L) and the node dielectric layer 14L above the top surface of the at least one pad dielectric layer (40, 50) are removed by planarization, which may employ chemical mechanical planarization (CMP) or an etch. The at least one inner conductor layer (18L, 16L) and the node dielectric layer 14L are further recessed into the deep trench 11 so that top surfaces of the remaining portions of the at least one inner conductor layer (18L, 16L) and the node dielectric layer 14L are located between the top surface of the buried insulator layer 20 and the bottom surface of the buried insulator layer 20. The remaining portion of the node dielectric layer 14L constitutes a node dielectric 14. The remaining portion of the at least one inner conductor layer (18L, 16L) constitutes an inner electrode 17, which may consist of a polycrystalline or amorphous doped semiconductor portion 18, or may comprise a metallic inner electrode portion 16 and a polycrystalline or amorphous doped semiconductor portion 18. A buried strap cavity 59 is formed within the deep trench 11 between the top surface of the inner electrode 17 and the top surface of the at least one pad dielectric layer (40, 50).

The top semiconductor collar dielectric 32 and exposed corner portions of the buried insulator layer 20 adjacent to the buried strap cavity 59 are removed by an etch, which is preferably an isotropic etch. For example, in case the top semiconductor collar dielectric 32 and the buried insulator layer 20 comprise silicon oxide, a hydrofluoric acid (HF) based wet etch may be employed to remove the top semiconductor collar dielectric 32 and exposed corner portions of the buried insulator layer 20 selective to the top semiconductor layer 30, which may comprise silicon. Optionally, a lateral pull-back etch may be employed to isotropically remove the any overhanging portions of the at least one pad dielectric layer (40, 50). For example, if the second pad dielectric layer 50 comprise silicon nitride, a wet etch that removes the second pad dielectric layer 50 selective to the exposed materials in the SOI substrate 8 may be employed so that the sidewalls of the second pad dielectric layer 50 are substantially vertically coincidental with sidewalls of the top semiconductor layer 30 around the buried strap cavity 59. The volume of the buried strap cavity 59 expands due to the removal of the top semiconductor collar dielectric 32, the exposed corner portions of the buried insulator layer 20, and the overhanging portions of at least one pad dielectric layer (40, 50).

Figure 6:
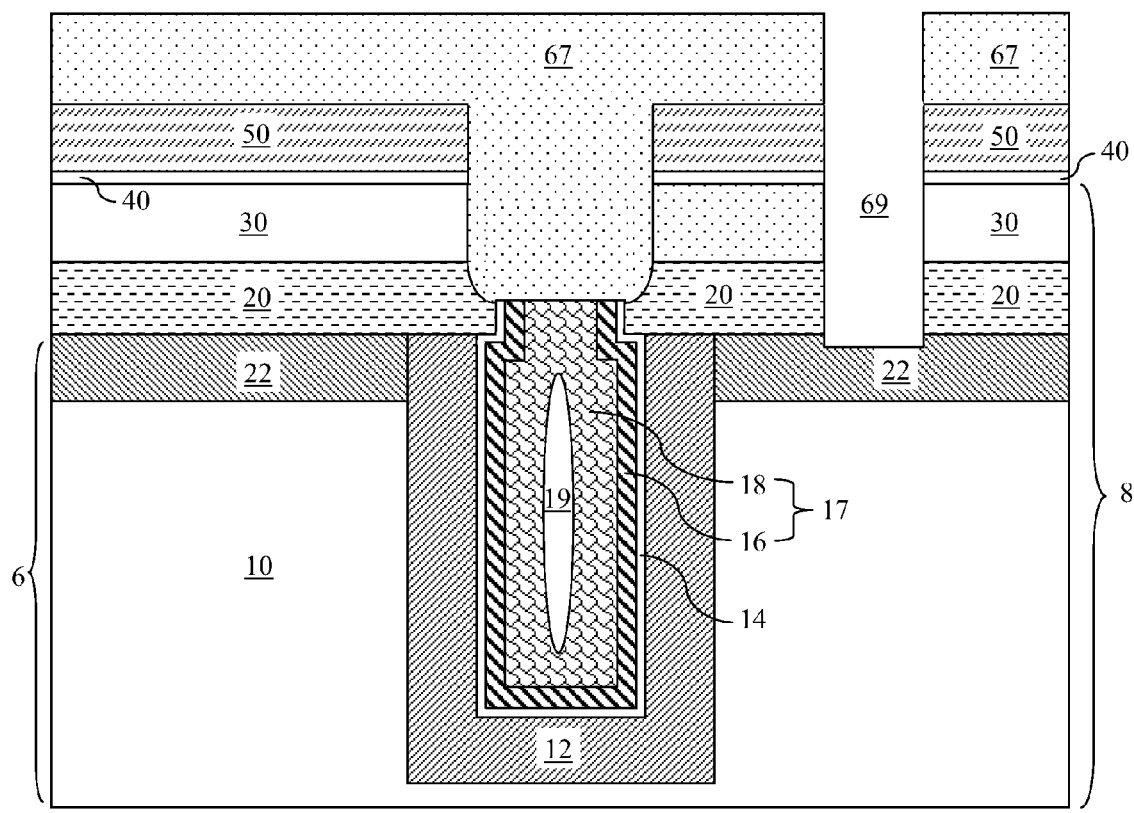
FIG. 6 is a vertical cross-sectional view of the exemplary semiconductor structure after formation of a buried layer contact via 69 according to the present invention.

Referring to FIG. 6, a photoresist 67 is applied over the at least one pad dielectric layer (40, 50) and in the buried strap cavity 59. The photoresist 67 is lithographically patterned to form a pattern of a hole located outside the area of the deep trench 11. The pattern in the photoresist 67 is transferred into the at least one pad dielectric layer (40, 50), the top semiconductor layer 30, the buried insulator layer 20, and an upper portion of the buried doped semiconductor layer 22 in the bottom semiconductor layer 6 by at least one anisotropic etch employing the photoresist 67 as an etch mask. A buried contact cavity 69 extending from the top surface of the photoresist 67 to a depth beneath the bottom surface of the buried insulator layer 20 and having substantially vertical sidewalls is thereby formed.

Figure 7:
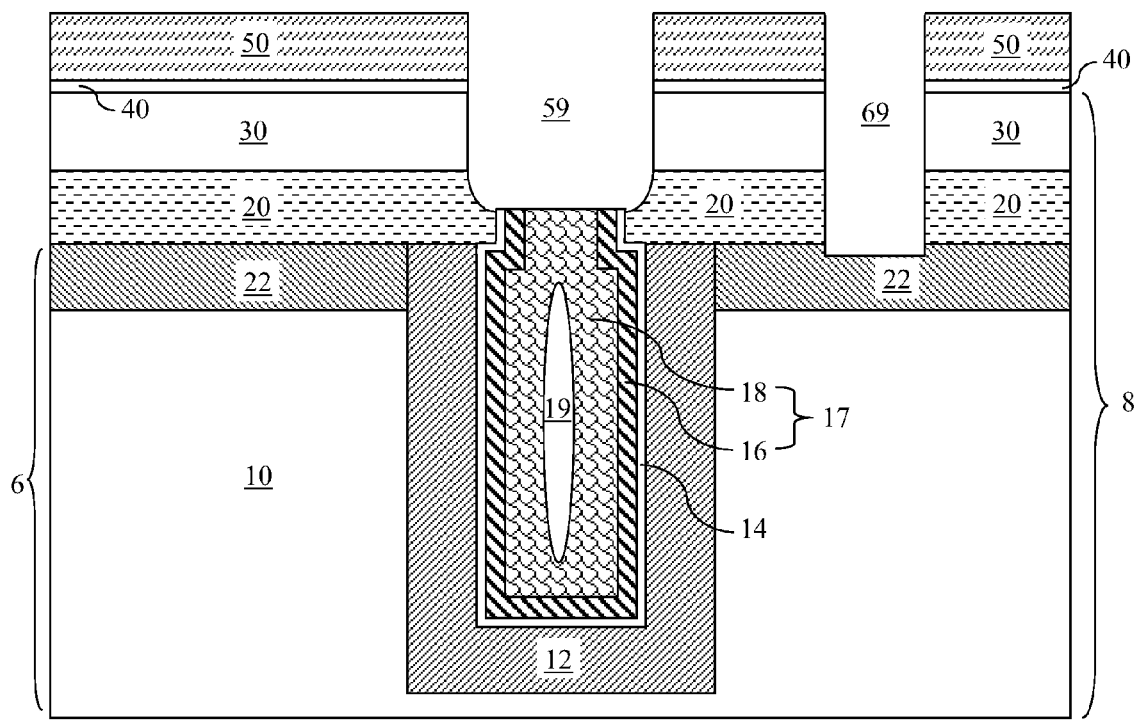
FIG. 7 is a vertical cross-sectional view of the exemplary semiconductor structure after removal of the photoresist 67 according to the present invention.

Referring to FIG. 7, the photoresist 67 is removed, for example, by ashing. The buried strap cavity 59 is exposed. A suitable clean may be performed to remove any organic residue from the exposed surfaces of the exemplary semiconductor structure.

Figure 8:
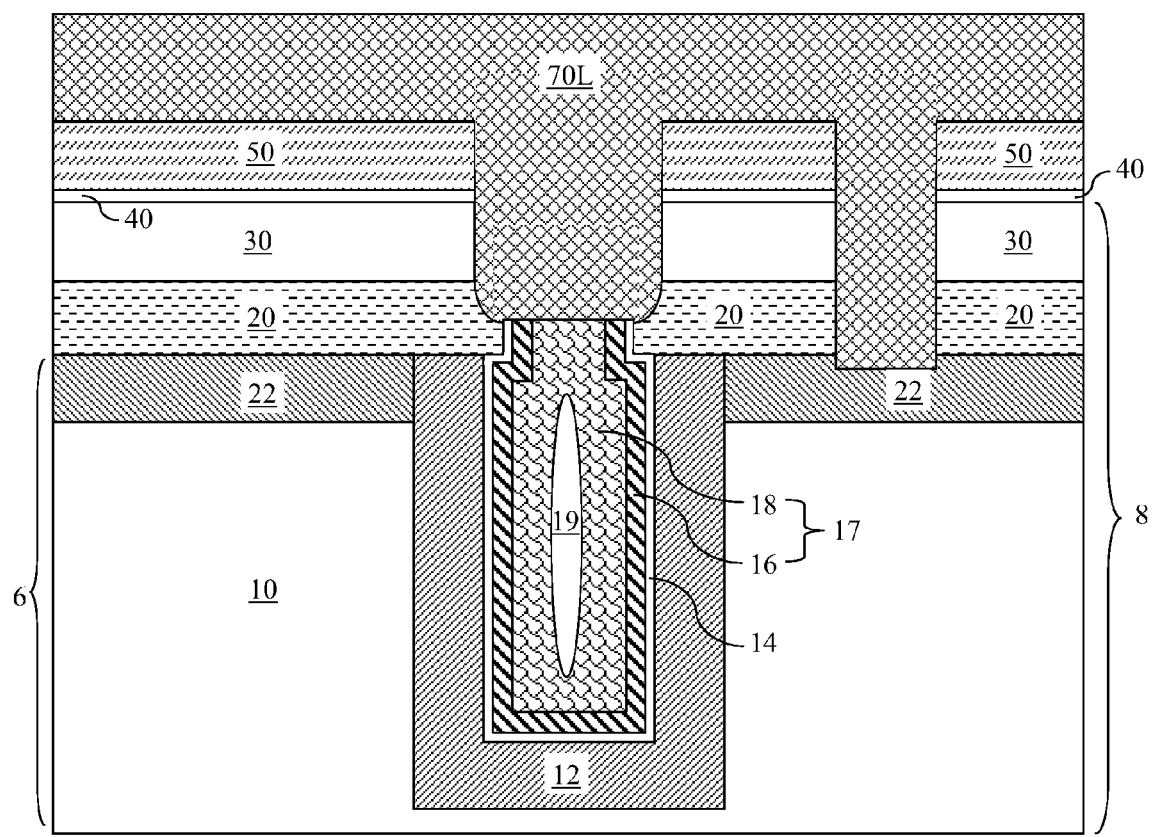
FIG. 8 is a vertical cross-sectional view of the exemplary semiconductor structure after deposition of a conductive material layer 70L according to the present invention.

Referring to FIG. 8, a conductive material layer 70L is deposited over the at least one pad dielectric layer (40, 50), into the buried strap cavity 59, and the buried layer contact cavity 69. The conductive material layer 70L may comprise a doped semiconductor material having a doping of the second conductivity type or a conductive metallic material. The conductive material layer 70L fills the buried strap cavity 59 and the buried layer contact cavity 69 simultaneously in the same processing step.

Exemplary doped semiconductor materials include, but are not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, other compound semiconductor materials, and/or alloys thereof. The doped semiconductor material may be polycrystalline or amorphous. Since the doped semiconductor material has a doping of the second conductivity type, the doping type of the doped semiconductor material in the conductive material layer 70L and the doping type of the buried doped semiconductor layer 22 are the same. In case the conductive material layer 70L comprises a doped semiconductor material, the dopant concentration of the conductive material layer 70L may be from about $1.0 \times 10^{19}/cm^3$ to about $1.0 \times 10^{21}/cm^3$, and typically from $3.0 \times 10^{19}/cm^3$ to about $5.0 \times 10^{20}/cm^3$, although lesser and greater dopant concentrations are also contemplated herein.

Exemplary conductive metallic materials include, but are not limited to, transition elements (i.e., elements in group III B, group IVB, group V B, group VI B, group VII B, group VIII B, Lanthanides, and Actinides), Al, Ga, In, Tl, Sn, Pb, Bi, an alloy thereof, a conductive nitride thereof, or an alloy of conductive nitrides thereof. For example, the conductive metallic material may comprise Ti, Ta, W, Cu, Co, TiN, TaN, WN, etc.

The conductive material layer 70L may be formed by chemical vapor deposition (CVD), physical vapor deposition (PVD), atomic layer deposition, etc. The deposition process employed for formation of the conductive material layer 70L may be conformal or non-conformal. The thickness of the conductive material layer 70L is greater than half the width of the buried strap cavity 59, and is greater than half the width of the buried layer contact cavity 69. Preferably, the buried strap cavity 59 and the buried layer contact cavity 69 are filled without a cavity.

Figure 9:
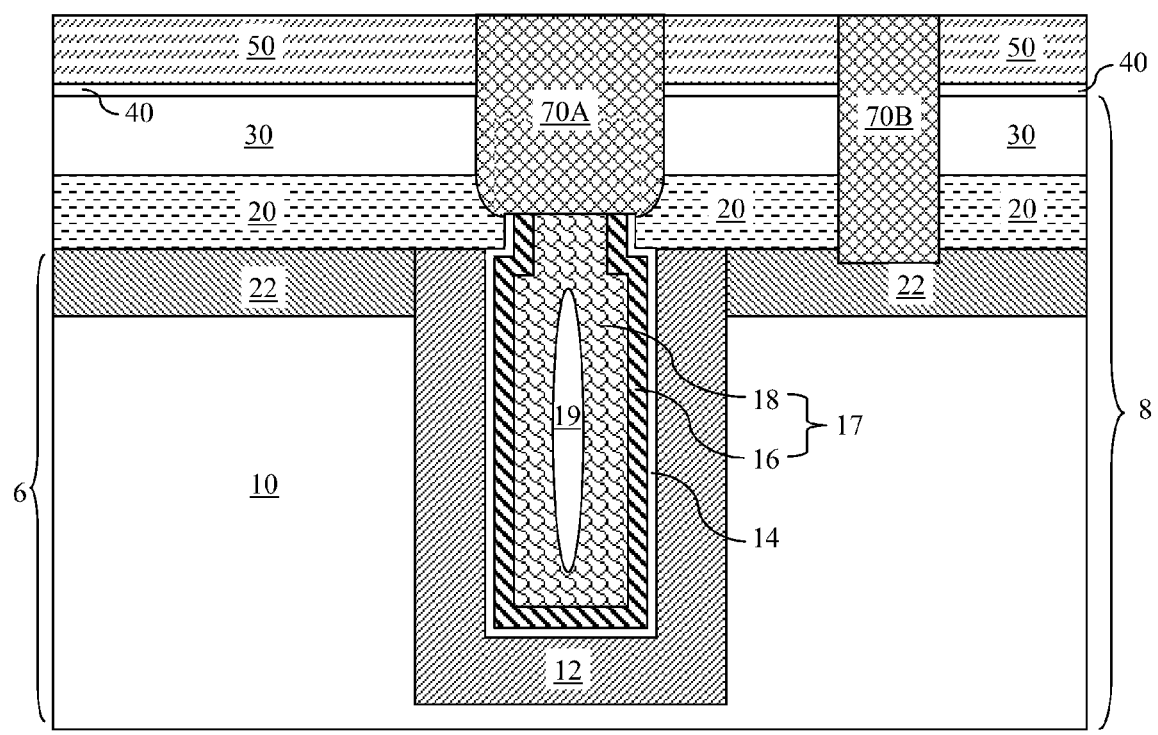
FIG. 9 is a vertical cross-sectional view of the exemplary semiconductor structure after planarization of the conductive material layer 70L according to the present invention.

Referring to FIG. 9, the conductive material layer 70L is planarized to the level of the top surface of the at least one pad dielectric layer (40, 50) employing chemical mechanical planarization (CMP) or an etch back processing step. The at least one pad dielectric layer (40, 50) may be employed as a stopping layer for the planarization process. The remaining portion of the conductive material layer 70L that fills the buried strap cavity 59 is herein referred to as a buried strap 70A. The remaining portion of the conductive material layer 70L that fills the buried layer contact cavity 69 is herein referred to as a buried contact via 70B. The buried strap 70A and the buried contact via 70B are formed by the same deposition step and the same planarization step. At the end of the planarization, the top surface of the buried strap 70A and the top surface of the buried contact via 70B are substantially coplanar with the top surface of the at least one pad dielectric layer (40, 50).

Figure 10:
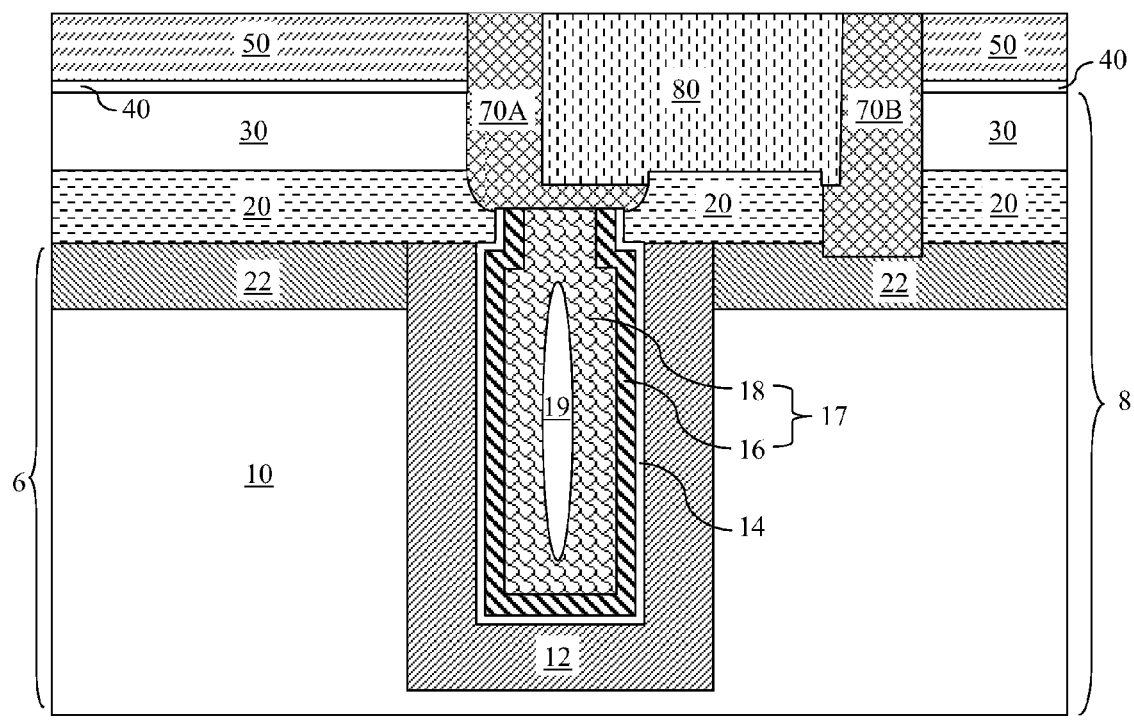
FIG. 10 is a vertical cross-sectional view of the exemplary semiconductor structure after formation of a shallow trench isolation structure 80 according to the present invention.

Referring to FIG. 10, a shallow trench isolation structure 80 is formed by application of another photoresist (not shown) and patterning of a shallow trench. Optionally, the shallow trench may overlie a portion of the overlying a portion of the buried strap 70A and a portion of the buried contact via 70B as well as an area between the buried strap 70A and the buried contact via 70B. The shallow trench is filled with a dielectric material such as dielectric oxide, dielectric nitride, dielectric oxynitride, or a combination thereof. Exemplary dielectric materials include silicon oxide, silicon nitride, silicon oxynitride, etc. The dielectric material is planarized employing chemical mechanical planarization (CMP), recess etch, or a combination thereof. The at least one pad dielectric layer (40, 50) may be employed as a stopping layer during the planarization processing step. The remaining portion of the dielectric material after planarization constitutes the shallow trench isolation structure 80, which has a top surface that is coplanar with the top surface of the at least one pad dielectric layer (40, 50), the top surface of the buried strap 70A, and the top surface of the buried contact via 70B. The shallow trench isolation structure 80 laterally abuts the buried strap 70A and the buried contact via 70B. The shallow trench isolation structure 80 may overlies a portion of the buried strap 70A and/or a portion of the buried contact via 80B.

Figure 11:
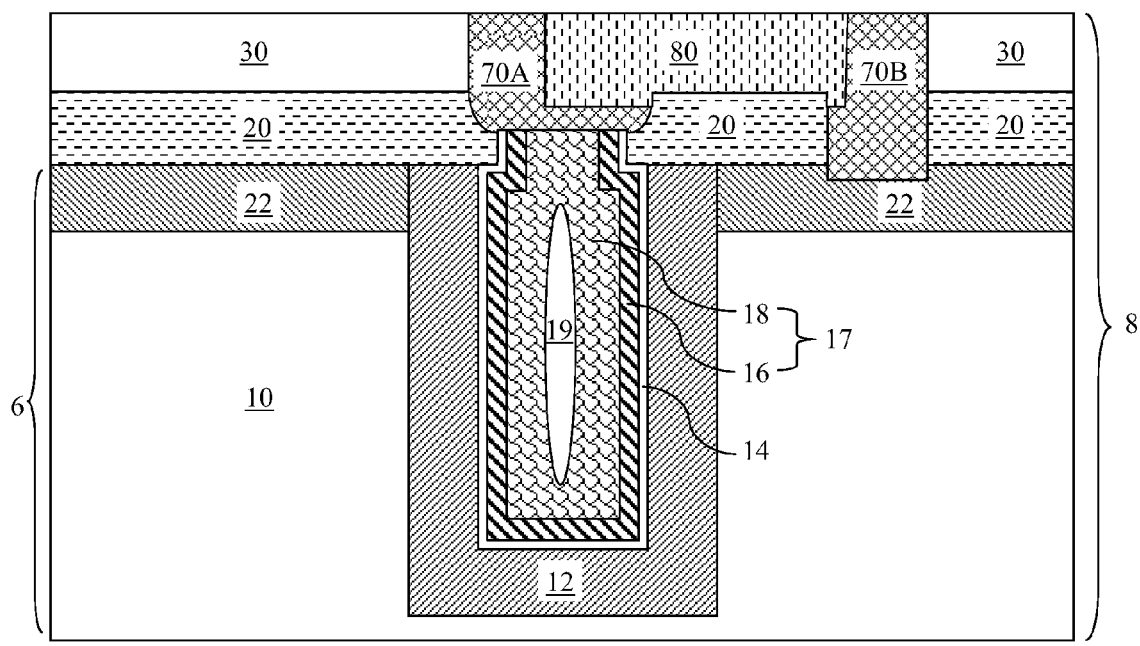
FIG. 11 is a vertical cross-sectional view of the exemplary semiconductor structure after recessing of the buried strap 70A and the buried contact via 70B and removal of the first pad dielectric layer 40 and the second pad dielectric layer 50 according to the present invention.

Referring to FIG. 11, the shallow trench isolation structure 80 is recessed relative to the top surface of the at least one pad dielectric layer (40, 50) to a depth that is substantially coplanar with the top surface of the top semiconductor layer 30. Further, the buried strap 70A and the buried contact via 70B are recessed to a depth substantially coplanar with the top surface of the top semiconductor layer 30. Preferably, the buried strap 70A and the buried contact via 70B are recessed simultaneously in the same recess etch processing step. The at least one pad dielectric layer (40, 50) are removed, for example, by at least one wet etch, selective to the top semiconductor layer 30. At this step, the top surfaces of the top semiconductor layer 30, the buried strap 70A, the buried contact via 70B, and the shallow trench isolation structure 80 are substantially coplanar.

Figure 12:
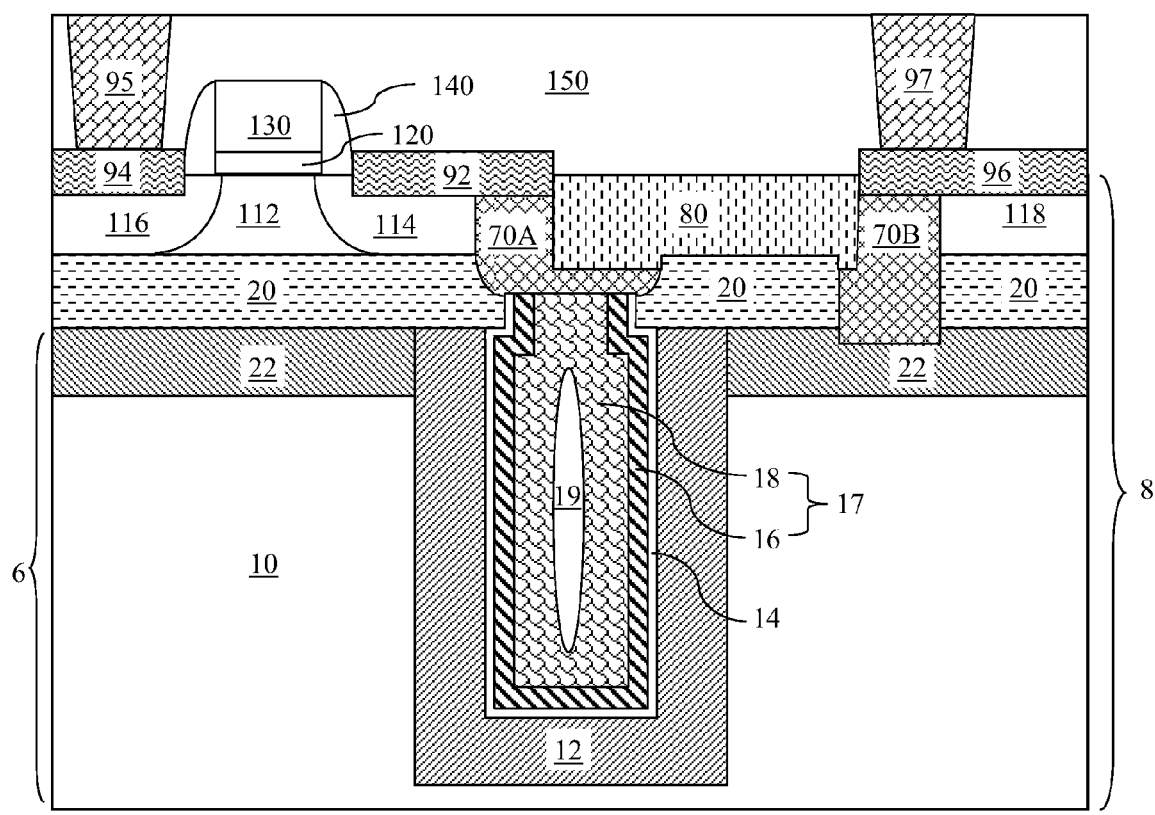
FIG. 12 is a vertical cross-sectional view of the exemplary semiconductor structure after formation of a field effect transistor and contact vias according to the present invention.

Referring to FIG. 12, semiconductor devices are formed in and/or on the top semiconductor layer 30. For example, a body region 112, a source region 114, and a drain region 116 of a field effect transistor may be formed in the top semiconductor layer 30. The field effect transistor comprises a gate dielectric 120, a gate electrode 140, and a gate spacer 140. The source region 114 may laterally abut the buried strap 70A so that the source region 114 of the field effect transistor is electrically connected to the inner electrode 17. The inner electrode 17, the node dielectric 14, and the buried plate 12 collectively constitute a deep trench capacitor. The inner electrode 17 is electrically connected to the field effect transistor, which is the access transistor of the deep trench capacitor (17, 14, 12).

The top semiconductor layer 30 comprises the body region 112, the source region 114, and the drain region 116, and other top semiconductor portions 118. Optionally, metal semiconductor alloy regions may be formed on top surfaces of the top semiconductor layer 30. For example, a source side metal semiconductor alloy region 92 may be formed directly on the source region 114. A drain side metal semiconductor alloy region 94 may be formed directly on the drain region 116. An outer electrode side metal semiconductor alloy region 96 may be formed directly on the buried contact via 70B if the buried contact via comprises a doped semiconductor material.

A middle-of-line (MOL) dielectric layer 150, which may include a mobile ion barrier layer (not shown), is deposited over shallow trench isolation structure 80, the gate electrode 130, the gate spacer 140, the source region 114, the drain region 116, and/or the outer electrode side metal semiconductor alloy region 96. The MOL dielectric layer 150 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Various contact via holes are formed in the MOL dielectric layer 150 and filled with metal to from various contact vias. The various contact vias include a drain contact via 95 electrically connected to the drain region 116 of the field effect transistor and an overlying contact via 97 electrically connected to the buried contact via 70B located over and on the buried contact via 70B. If the drain side metal semiconductor alloy region 94 is present, the drain contact via 95 may vertically abut the drain side metal semiconductor alloy region 94. If the drain side metal semiconductor alloy region 94 is not present, the drain contact via 95 vertically abuts the drain region 116. If the outer electrode side metal semiconductor alloy region 96 is present, the overlying contact via 97 may vertically abut the outer electrode side metal semiconductor alloy region 96. If the outer electrode side metal semiconductor alloy region 96 is not present, the overlying contact via 97 vertically abuts the buried contact via 70B.

The buried doped semiconductor layer 22, the buried contact via 70, and the outer electrode side metal semiconductor alloy region 96, if present, provide an electrically conductive path between the buried plate 12, which is the outer electrode of the deep trench capacitor (17, 14, 12) to the overlying contact via 97. The inner electrode 17 is electrically connected to the source region 114 of the field effect transistor through the buried strap 70A. The field effect transistor controls the electrical connection between the drain contact via 95 and the source region 114 by turning on or turning off.

Figure 13:
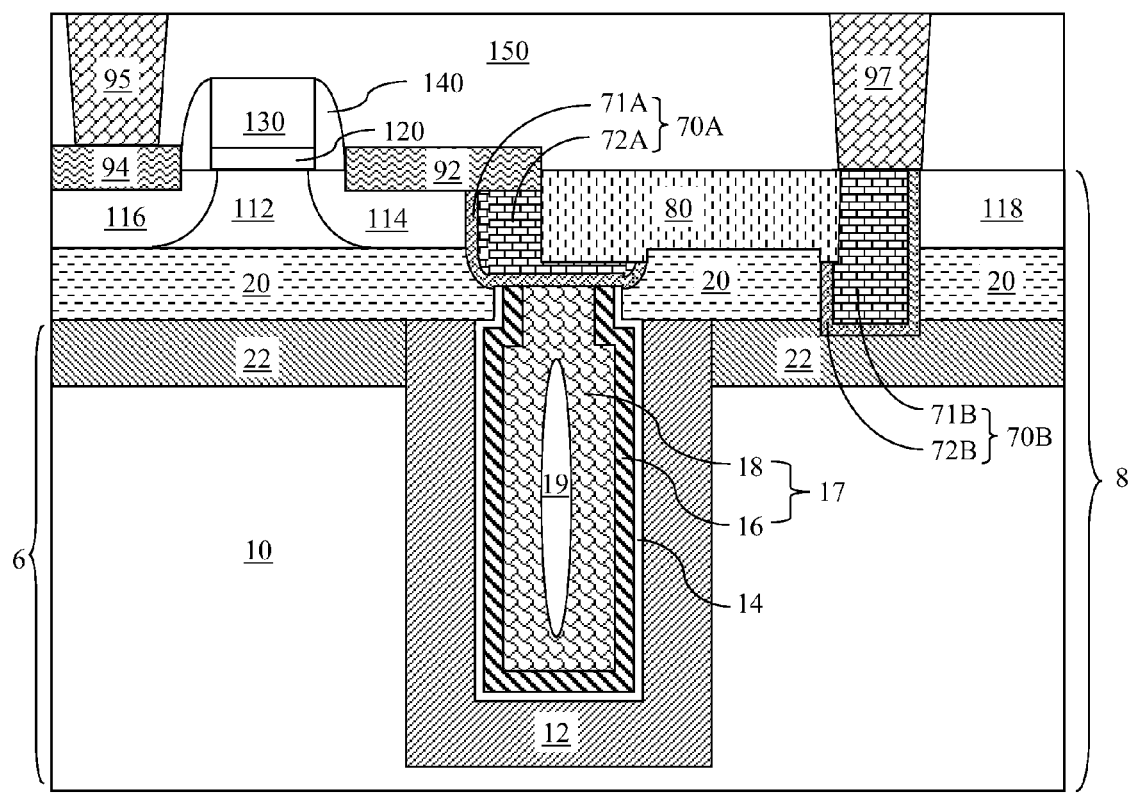
FIG. 13 is a vertical cross-sectional view of a variation of the exemplary semiconductor structure after formation of a field effect transistor and contact vias according to the present invention.

Referring to FIG. 13, a variation of the exemplary semiconductor structure according to the present invention is shown, in which the buried strap 70A and the buried contact via 70B comprises a metallic liner portion and a metal fill portion. Specifically, the buried strap 70A comprises a buried strap metallic liner portion 71A and a buried strap metal fill portion 72A. Likewise, the buried contact via 70B comprises a buried via metallic liner portion 71B and a buried via metal fill portion 72B. The variation of the exemplary semiconductor structure is formed by depositing a metallic liner and a metal fill material for the conductive material layer 70L described above, i.e., the conductive material layer 70L comprises a stack of the metallic liner and the metal fill material. Typically, the metallic liner may comprises a conductive nitride of an elemental metal or an alloy of elemental metals, in which the elemental metal or the alloy of the elemental metals comprise at least one of transition elements (i.e., elements in group III B, group IVB, group V B, group VI B, group VII B, group VIII B, Lanthanides, and Actinides), Al, Ga, In, Tl, Sn, Pb, Bi, and an alloy thereof. The metal fill material typically comprises an elemental metal or an alloy of elemental metals, in which the elemental metal or the alloy of the elemental metals comprise at least one of transition elements (i.e., elements in group III B, group IVB, group V B, group VI B, group VII B, group VIII B, Lanthanides, and Actinides), Al, Ga, In, Tl, Sn, Pb, Bi, and an alloy thereof.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a deep trench in a semiconductor-on-insulator (SOI) substrate;
   forming an inner electrode in said deep trench;
   forming a buried strap cavity over said inner electrode in an upper portion of said deep trench;
   forming a buried layer contact cavity extending from a top surface of a top semiconductor layer of said SOI substrate to a depth beneath a bottom surface of a buried insulator layer; and
   simultaneously forming a buried strap within said buried strap cavity and a buried contact via within said buried layer contact cavity, wherein said buried strap and said buried contact via comprise a same conductive material.

2. The method of claim 1, further comprising forming a node dielectric layer directly on sidewalls of said deep trench.

3. The method of claim 2, further comprising forming at least one inner conductor layer within said deep trench on said node dielectric layer, wherein said at least one conductive layer comprises a polycrystalline doped semiconductor layer or an amorphous doped semiconductor layer.

4. The method of claim 3, wherein said at least one conductive layer further comprises a metallic inner electrode layer formed directly on said node dielectric layer, wherein said polycrystalline doped semiconductor layer or said amorphous doped semiconductor layer is formed directly on said metallic inner electrode layer.

5. The method of claim 4, further comprising recessing said node dielectric layer and said at least one inner conductor layer beneath said top surface of said top semiconductor layer to a depth between a top surface of said buried insulator layer and a bottom surface of said buried insulator layer, wherein said buried strap cavity is a volume located inside said deep trench above a top surface of said at least one inner conductor layer after said recessing of said node dielectric layer and said at least one inner conductor layer.

6. The method of claim 1, further comprising:
   applying a photoresist over said top surface of said top semiconductor layer and within said buried strap cavity;
   lithographically patterning a hole in said photoresist over an area outside said deep trench; and
   anisotropically etching said top semiconductor layer and said buried insulator layer underneath said hole to a depth beneath a bottom surface of said buried insulator layer employing said photoresist as an etch mask, wherein a void within said top semiconductor layer and said buried insulator layer beneath said hole constitutes said buried layer contact cavity.

7. The method of claim 6, further comprising:
   depositing a conductive material layer within said buried strap cavity and said buried layer contact cavity; and
   planarizaing said conductive material layer, wherein a remaining portion of said conductive material layer in said deep trench constitutes said buried strap, and wherein a remaining portion of said conductive material layer in said buried layer contact cavity constitutes said buried contact via.

8. The method of claim 7, further comprising forming at least one pad dielectric layer on said top surface of said top semiconductor layer prior to formation of said deep trench, wherein said conductive material layer is planarized employing said at least one pad dielectric layer as a stopping layer, and wherein said buried strap and said buried contact via have top surfaces that are coplanar with a top surface of said at least one pad dielectric layer.

9. The method of claim 8, further comprising forming a shallow trench isolation structure having a top surface coplanar with said top surface of said at least one pad dielectric layer and laterally abutting said buried strap and said buried contact via.

10. The method of claim 9, wherein said shallow trench isolation structure overlies a portion of said buried strap and a portion of said buried contact via.

11. The method of claim 9, further comprising:
   recessing said shallow trench isolation structure to a depth substantially coplanar with said top surface of said top semiconductor layer;
   simultaneously recessing said buried strap and said buried contact via to a depth substantially coplanar with said top surface of said top semiconductor layer; and
   removing said at least one pad dielectric layer selective to said top semiconductor layer.

12. The method of claim 11, further comprising:
- forming a field effect transistor in said top semiconductor layer, wherein a source region of said field effect transistor laterally abuts said buried strap;
- forming a drain contact via electrically connected to a drain region of said field effect transistor; and
- forming an overlying contact via electrically connected to said buried contact via over and on said buried contact via.

13. A semiconductor structure comprising:
- a deep trench located in a semiconductor-on-insulator (SOI) substrate and extending at least from a top surface of said SOI substrate to a first depth in said SOI substrate;
- a buried plate laterally surrounding sidewalls of said deep trench and comprising a doped semiconductor material;
- a buried doped semiconductor layer having a topmost surface that contacts an area of a bottom surface of a buried insulator layer in said SOI substrate, said buried doped semiconductor layer further contacts an area of an upper portion of said buried plate;
- an inner electrode located inside said deep trench, wherein a topmost surface of said inner electrode is located beneath a top surface of said buried insulator layer;
- a buried strap located inside said deep trench and abutting a top surface of said inner electrode; and
- a buried contact via extending from a top surface of a top semiconductor layer of said SOI substrate to said buried doped semiconductor layer, wherein said buried strap have the same material composition as said buried contact via, a bottommost surface of said buried contact via is located at a second depth that is less than said first depth.

14. The semiconductor structure of claim 13, further comprising a semiconductor portion located in a bottom semiconductor layer of said SOI substrate and laterally abutting and surrounding said buried plate, wherein said semiconductor portion has a doping of first conductivity type, said buried plate has a doping of a second conductivity type, said buried doped semiconductor layer has a doping of said second conductivity type, wherein said second conductivity type is the opposite of said first conductivity type.

15. The semiconductor structure of claim 14, wherein said semiconductor portion, said buried plate, and said buried doped semiconductor layer comprise single crystalline semiconductor material and are epitaxially aligned among one another.

16. The semiconductor structure of claim 13, wherein said inner electrode comprises a polycrystalline doped semiconductor material or an amorphous doped semiconductor material.

17. The semiconductor structure of claim 16, further comprising a node dielectric abutting said buried plate and located beneath a top surface of said buried insulator layer and abutting said inner electrode, wherein said inner electrode further comprises a metallic material abutting said node dielectric and one of said polycrystalline doped semiconductor material and said amorphous doped semiconductor material.

18. The semiconductor structure of claim 13, wherein said buried strap and said buried contact via comprise a polycrystalline doped semiconductor material having a same conductivity type as said buried doped semiconductor layer or a metallic material.

19. The semiconductor structure of claim 13, further comprising a shallow trench isolation structure laterally abutting said buried strap and said buried contact via and overlying a portion of said buried strap and a portion of said buried contact via and having a top surface that is substantially coplanar with said top surface of said top semiconductor layer.

20. The semiconductor structure of claim 13, further comprising:
- a field effect transistor located in said top semiconductor layer, wherein a source region of said field effect transistor laterally abuts said buried strap;
- a drain contact via electrically connected to a drain region of said field effect transistor; and
- an overlying contact via electrically connected to said buried contact via and located over and on said buried contact via.

\* \* \* \* \*